(12) United States Patent
Kim et al.

(10) Patent No.: US 9,082,850 B2
(45) Date of Patent: Jul. 14, 2015

(54) SEMICONDUCTOR DEVICE HAVING BURIED CHANNEL ARRAY

(71) Applicant: SAMSUNG ELECTRONICS CO., LTD., Suwon-Si, Gyeonggi-Do (KR)

(72) Inventors: Na-Ra Kim, Seongnam-Si (KR); Seung-Hwan Kim, Hwaseong-Si (KR); Sung-Hee Lee, Osan-Si (KR); Dae-Sin Kim, Hwaseong-Si (KR); Ji-Young Kim, Yongin-Si (KR); Dong-Soo Woo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/959,765

(22) Filed: Aug. 6, 2013

(65) Prior Publication Data
US 2014/0110786 A1    Apr. 24, 2014

(30) Foreign Application Priority Data

Oct. 24, 2012  (KR) .................. 10-2012-0118562

(51) Int. Cl.
H01L 29/66   (2006.01)
H01L 29/78   (2006.01)
H01L 27/108  (2006.01)
H01L 29/423  (2006.01)
H01L 21/762  (2006.01)

(52) U.S. Cl.
CPC ........ H01L 29/785 (2013.01); H01L 21/76229 (2013.01); H01L 27/10876 (2013.01); H01L 27/10891 (2013.01); H01L 29/4236 (2013.01)

(58) Field of Classification Search
USPC ........... 257/20, 194, 135–136, 213–413, 900, 257/902–903; 438/136, 137, 156, 173, 192, 438/206, 212, 424, 427, 428, 591
See application file for complete search history.

(56) References Cited

U.S. PATENT DOCUMENTS

2008/0191288 A1*  8/2008  Kwon et al. .................. 257/383
2010/0258858 A1* 10/2010  Kim ............................. 257/330
2011/0186924 A1*  8/2011  Chun ........................... 257/331

* cited by examiner

Primary Examiner — Selim Ahmed
Assistant Examiner — Moin Rahman
(74) Attorney, Agent, or Firm — Volentine & Whitt, PLLC

(57) ABSTRACT

A semiconductor device includes a field regions in a substrate to define active regions, gate trenches including active trenches disposed across the active region and field trenches in the field regions, and word lines that fill the gate trenches and extend in a first direction. The word lines include active gate electrodes occupying the active trenches, and field gate electrodes occupying the field trenches. The bottom surface of each field gate electrode, which is disposed between active regions that are adjacent to each other and have one word line therebetween, is disposed at a higher level than the bottom surfaces of the active gate electrodes.

7 Claims, 19 Drawing Sheets

SEMICONDUCTOR DEVICE HAVING BURIED CHANNEL ARRAY

PRIORITY STATEMENT

This application claims priority under 35 U.S.C. §119 to Korean Patent Application No. 10-2012-0118562 filed on Oct. 24, 2012, the disclosure of which is hereby incorporated by reference in its entirety.

BACKGROUND

1. Field

The inventive concept relates to a semiconductor device having a buried channel array, a method of manufacturing the device, and an electronic device and electronic system adopting the device.

2. Description of Related Art

One technique aimed at increasing the integration density of semiconductor devices is to form the word lines of the device in a substrate, i.e., to form buried word lines.

SUMMARY

According to one aspect of the inventive concept, there is provided a semiconductor device comprising a substrate and a field region disposed in the substrate and defining active regions of the substrate, and in which the substrate has active trenches therein extending in and across the active regions, and the field region has field trenches therein, and word lines respectively occupying gate trenches each constituted by respective ones of the active and field trenches together, and in which each of the word lines extends longitudinally in a first direction across a plurality of the active regions, the word lines include active gate electrodes disposed within the active trenches, and field gate electrodes disposed within the field trenches, and each of the field gate electrodes is disposed between respective ones of the active regions that are adjacent to each other with one word line therebetween, and has a bottommost surface disposed at a level than higher than bottommost surfaces of the active gate electrodes.

According to another aspect of the inventive concept, there is provided a semiconductor device comprising a substrate, and a field region disposed in the substrate and defining active regions of the substrate, and in which the substrate has active trenches therein extending in and across the active regions, and the field region has field trenches therein, word lines respectively occupying gate trenches each constituted by respective ones of the active and field trenches together; and in which each of the word lines extends longitudinally in a first direction across a plurality of the active regions, the word lines include active gate electrodes disposed within the active trenches, field gate electrodes disposed within the field trenches, and fin gate electrodes each interposed between a portion of the field region and an active region in the first direction, and each of the field gate electrodes has a bottommost surface disposed at a level higher than that of the bottommost surfaces of the fin gate electrodes.

According to still another aspect of the inventive concept, there is provided a semiconductor device comprising a substrate and a field region disposed in the substrate and defining active regions of the substrate, and in which the substrate has active trenches therein extending in and across the active regions, the field region has field trenches therein, gate trenches are each constituted by respective ones of the active and field trenches together that are contiguous in first direction, and the field trenches have a depth that is different from that of the active trenches, and word lines respectively occupying the gate trenches, respectively, including at the bottommost portion thereof such that each of the word lines has a first section occupying the bottommost portion of at least one of the active trenches and a second section occupying the bottommost portion of at least one of the field trenches, and each of the word lines extending longitudinally in the first direction across a plurality of the active regions, and in which opposite surfaces of the first section of one of the word lines face side surfaces of the second sections of neighboring ones of the word lines, respectively.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters designate like parts throughout the different figures. The drawings are not necessarily to scale, emphasis instead being placed upon illustrating the principles of the inventive concepts. In the drawings.

DETAILED DESCRIPTION OF THE PREFERRED EMBODIMENTS

Figure 1:
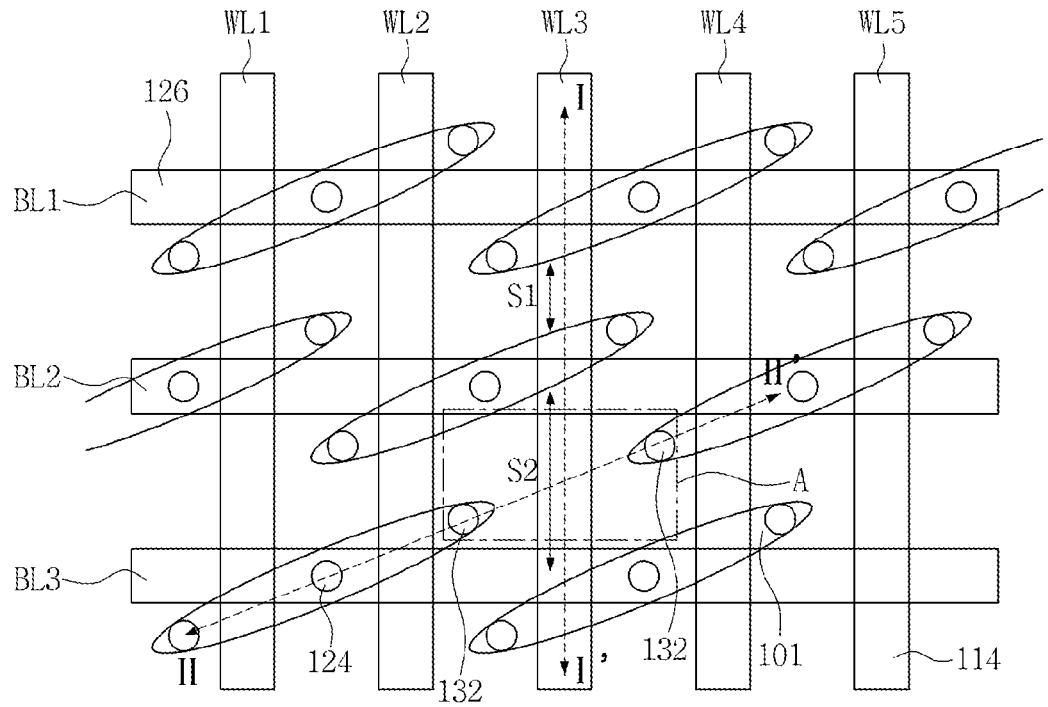
FIG. 1 is a plan view of embodiments of a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "upper" or "bottom" as used to describe a surface generally refer not only to the orientation depicted in the drawings but to the fact that the surface is the uppermost or bottommost surface in the orientation depicted, as would be clear from the drawings and context of the written description.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

An example of a first embodiment of semiconductor device according to the inventive concept will now be described with reference to FIGS. 1, 3A, and 3B.

In this example, the semiconductor device includes a substrate 100 having active regions 101 and field regions 104, gate structures 115 in the substrate 100, and bit line structures 125 and capacitor structures 135 on the substrate 100.

The substrate 100 is a semiconductor substrate. For example, the substrate 100 is a silicon (Si) substrate, a germanium (Ge) substrate, or a silicon-germanium (SiGe) substrate. The substrate 100 may include a memory cell array region in which memory cells are formed, and a peripheral circuit region in which peripheral circuits configured to operate the memory cells are formed.

The field regions 104 define the active regions 101. The field regions 104 may be shallow trench isolation (STI) regions. For example, each of the field regions 104 may be an insulating layer filling a trench 102 formed in the substrate 100. The insulating layer may include silicon oxide.

Each of the active regions 101 may be elongated island-shaped regions, i.e., may have a major axis and a minor axis. The active regions 101 may also be arrayed 2-dimensionally in the directions of the major and minor axes.

The gate structures 115 include word lines 114 (WL1, WL2, WL3, WL4, and WL5), respectively. The word lines 114 each extend longitudinally in a first direction across a plurality of the active regions 101. The bit line structures 125 include bit lines 126 (BL1, BL2, and BL3) each of which may extend longitudinally in a second direction orthogonal to the first direction.

The active regions 101 may be oriented such that their major axes are oblique with respect to the word lines 114 and the bit lines 126 and may be sized such that one active region 101 intersects two word lines 114 and one bit line 126 (as viewed in plan). Accordingly, one active region 101 may have two unit cell structures. Each such unit cell may have a length of 2F in the first direction and a length of 4F in the second direction, and have an area of 6F2. Here, F refers to a minimum feature size. In this example, a cell area of the 6F2 cell structure is minimal.

Figure 2:
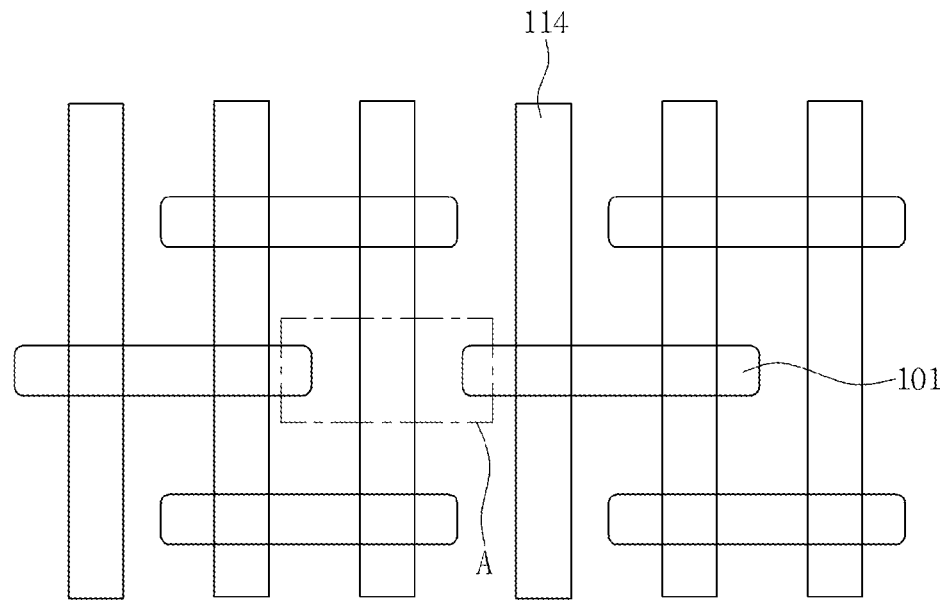
FIG. 2 is a plan view of another version of embodiments of a semiconductor device according to the inventive concept.

However, a semiconductor device according to the inventive concept is not limited to having an 6F2 cell structure layout as described above and as illustrated in FIG. 1, and instead may have an 8F2 cell structure layout in which active regions 101 intersect word lines 114 at right angles (as viewed in plan as shown in FIG. 2). Also, semiconductor devices according to the inventive concept may employ other cell structure layouts as desired.

The gate structures 115 occupy gate trenches 106 in the substrate 100 and in addition to the world lines 114, may include gate insulating layers 108 conformally formed on inner surfaces of the substrate 100 delimiting the gate trenches 106.

The word lines 114 in this embodiment are buried gate lines and constitute buried channel transistors. Buried channel transistors have a smaller unit cell area and greater effective channel length as compared with planar transistors. Also, with buried channel transistors the capacitance between the word line 114 and the bit line 126 is minimal as is the total capacitance associated with the bit line 126, i.e., parasitic capacitance is minimized.

Each of the gate trenches 106 may include an active trench 106a formed across the corresponding active region 101, and a field trench 106f formed in the corresponding field region 104. The active trench 106a and the field trench 106f may be contiguous.

Each of the word lines 114 may include an active gate electrode 114a occupying the active trench 106a, and a field gate electrode 114f occupying the field trench 106f. Each of the word lines 114 has a first section occupying the bottommost portion of at least one of the active trenches 106a and a second section occupying the bottommost portion of at least one of the field trenches 106f. The opposite surfaces of the first section of one of the word lines 114 face side surfaces of the second section of neighboring ones of the word lines 114. Top surfaces of the active gate electrode 114a and the field gate electrode 114f may be at substantially the same level or at similar levels within the active region 101 and the field region 104.

Each of the active regions 101 has first impurity region 117s and a second impurity region 117d on opposite sides of the active gate electrode 114a and which serve as a source and a drain of a transistor. The first impurity region 117s may be electrically connected to the corresponding capacitor structure 135, while the second impurity region 117d may be electrically connected to the corresponding bit line structure 125.

Also, in this example, the active trench 106a and the field trench 106f have bottoms disposed at different levels. For example, the field trench 106f may have a depth d1 less than the depth d2 of the active trench 106a so that the bottom of the field trench 106f is disposed at a higher level than the bottom of the active trench 106a.

Thus, in this example, a bottom surface b1 of the field gate electrode 114f disposed in and across the field region 104 is disposed at a higher level than a bottom surface b2 of the active gate electrode 114a disposed in and across the active region 101. In particular, the bottom surface b1 of the field gate electrode 114f disposed in the field region 104 between the first impurity regions 117s of the active regions 101 disposed adjacent to each other with one word line 114 therebetween (e.g., first impurity regions 117s in section A in FIG. 1 adjacent one another along line II-II'), is disposed at a higher level than the bottom surface b2 of the active gate electrode 114a. As a result, the area (of the side surface) of the field gate electrode 114f of a word line that faces (is projected onto the side surface of) the active gate electrode 114a of a neighboring word line is relatively small, such that word line disturbance between adjacent cells is suppressed.

For instance, in FIG. 1, assuming the case in which the second word line WL2 is turned off and the third word line WL3 is turned on. In this case, parasitic capacitance between the active gate electrode 114a of the second word line WL2 and the field gate electrode 114f of the third word line WL3 is minimized because the area of the field gate electrode 114f of the third word line WL3 that faces the active gate electrode 114a of the second word line WL2 is comparatively small (compared to the case in which that active and field gate electrodes are formed together in trenches of the same depths). Thus, a phenomenon in which the electric potential of a channel region disposed under the active gate electrode 114a of the turned-off second word line WL2 rises due to a voltage applied to the field gate electrode 114f of the third word line WL3 (i.e., word line disturbance) can be prevented.

Figure 3A:
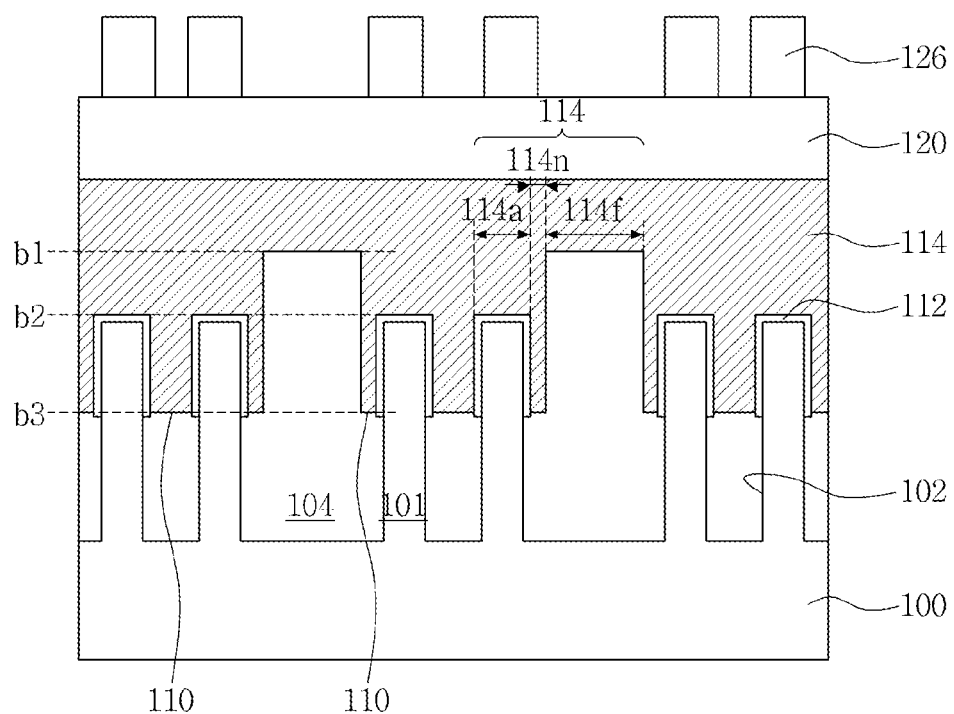
FIG. 3A is a cross-sectional view of an embodiment of a semiconductor device according to the inventive concept as taken along line I-I' of FIG. 1.

Referring still to FIGS. 1 and 3A, the field region 104 includes first and second regions s1 and s2 along the lengthwise direction of each of the word lines WL. Each first region s1 of the field region 104 spaces respective ones of the active regions 101 apart from one another by a first distance in the first direction, and each second region s2 of the field region 104 spaces respective ones of the active regions 101 apart from one another by a second distance greater than the first distance in the first direction.

The bottom surface b1 of the field gate electrode 114f at the top of the second region s2 is disposed at a higher level than the bottom surface b2 of the active gate electrode 114a.

Furthermore, in this embodiment, fin recesses 110 are defined between the field regions 104 and the active regions 101 in the direction of the word lines 114, that is, in the first direction. In particular, fin recesses 110 may be located on the sides of the active regions 101 in the first and second regions s1 and s2. Each gate structure 115 in this embodiment also includes fin gate electrodes 114n occupying the fin recesses 110. Furthermore, fin insulating layers 112 may extend between the active regions 101 and the fin gate electrodes 114n and serve the same function as the gate insulating layers 108.

Top surfaces of the active gate electrodes 114a, the field gate electrodes 114f, and the fin gate electrodes 114n may be disposed at substantially similar levels in the active region 101 and the field region 104.

The bottom surfaces b3 of the fin gate electrodes 114n are disposed at a lower level than the bottom surfaces b1 of the field gate electrodes 114f. The bottom surfaces b3 of the fin gate electrodes 114n are also disposed at a lower level than the bottom surfaces b2 of the active gate electrodes 114a.

More specifically, respective ones of the fin gate electrodes 114n (whose bottom surfaces b3 are disposed at a lower level than the bottom surfaces b2 of the active gate electrodes 114a) are provided in the first region s1 in which word line disturbance is suppressed between adjacent cells. Accordingly, the fin gate electrodes 114n ensure that a sufficient channel length is provided so that the driving current of a transistor constituting the gate structure 115 provided with the fin gate electrodes can be increased and operating characteristics of the transistor can be improved.

The gate structures 115 may further include a gate capping layer 116 disposed on the gate electrodes 114 and filling upper regions of the gate trenches 106.

In addition to an aforementioned bit line 126, each of the bit line structures 125 may also include a bit line contact pad 118b on the second impurity region 117d, a bit line contact hole 122 leading to (and into, as shown) the bit line contact pad 118b, and a bit line contact plug 124 filling the bit line contact hole 122. The bit line 126 is disposed directly on the bit line contact plug 124 in the illustrated example.

Each of the capacitor structures 135 may include a storage contact pad 118s on the first impurity region 117s, a storage contact hole 130 leading to (and into, as shown) the storage contact pad 118s, a storage contact plug 132 filling the storage contact hole 130, and a capacitor electrode 134 disposed directly on the storage contact plug 132.

In this example, the storage contact pad 118s and the bit line contact pad 118b may be contact hole type of contact pads 118 and may have different sectional areas.

Furthermore, a first interlayer insulating layer 120 is disposed on the substrate 100 including over the gate structures 115, storage contact pads 118s, and bit line contact pads 118b. The bit line contact hole 122 extends through the first interlayer insulating layer 120 and exposes the bit line contact pad 118b.

A second interlayer insulating layer 128 may be disposed on the bit line structures 125 and the first interlayer insulating layer 120. In this case, the storage contact hole 130 extends through the first and second interlayer insulating layers 120 and 128 and exposes the storage contact pad 118s.

Figure 4:
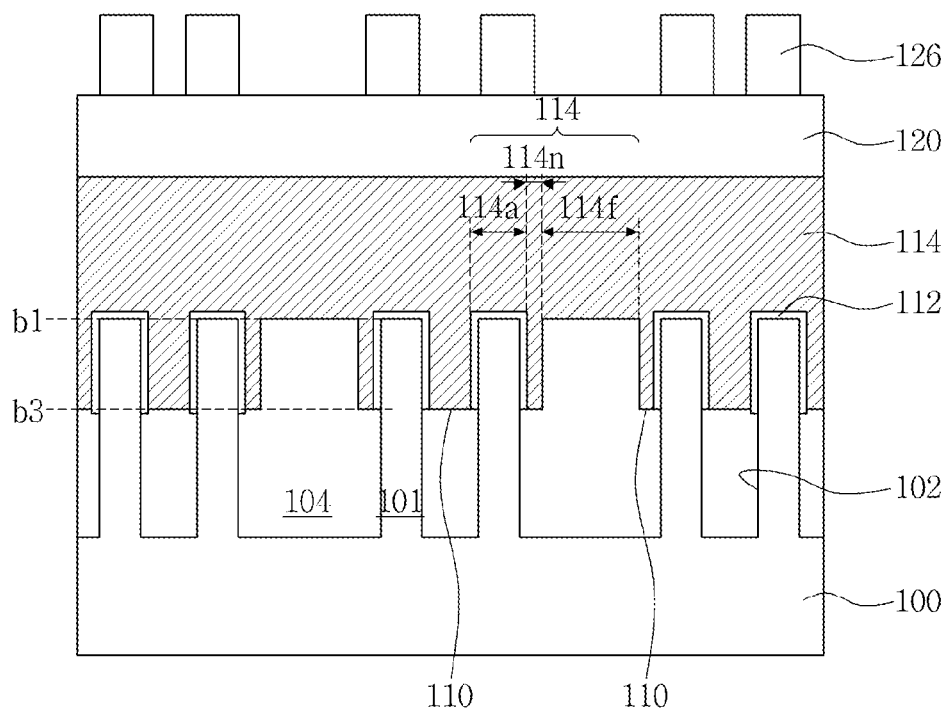
FIG. 4 is a cross-sectional view of a second embodiment of a semiconductor device according to the inventive concept as taken along line I-I' of FIG. 1.

A second embodiment of a semiconductor device according to the inventive concept will now be described with reference to FIGS. 1 and 4. Here, features similar to those of the first embodiment will not be described again in detail, though. That is, mainly only those features which differentiate this embodiment from the first embodiment will be described in detail.

In this embodiment of a semiconductor device according to the inventive concept, the bottom surfaces b1 of the field gate electrodes 114f are disposed at the same level as the bottom surfaces of the active gate electrodes 114a. Also, the bottom surfaces b1 of the field gate electrodes 114f are disposed at a higher level than the bottom surfaces b3 of the fin gate electrodes 114n.

Figure 5:
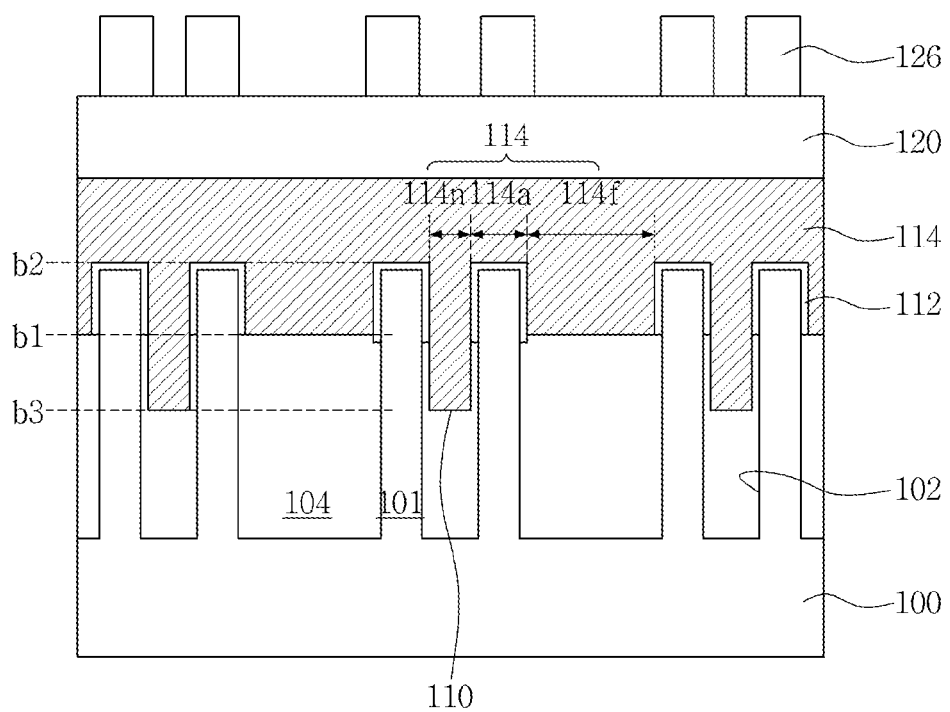
FIG. 5 is a cross-sectional view of a third embodiment of a semiconductor device according to the inventive concept as taken along line I-I' of FIG. 1.

A third embodiment of a semiconductor device according to the inventive concept will now be described with reference to FIGS. 1 and 5. Here, again, features similar to those of the first embodiment will not be described in detail, though.

In this embodiment of a semiconductor device according to the inventive concept, recess fins 110 are provided in the first regions s1 of the field regions 104 but not in the second regions s2.

Furthermore, the bottom surfaces b1 of the field gate electrodes 114f are disposed at a lower level than bottom surfaces b2 of the active gate electrodes 114a. The bottom surfaces b1 of the field gate electrodes 114f are disposed at a higher level than bottom surfaces b3 of the fin gate electrodes 114n. On the other hand, the bottom surfaces b3 of the fin gate electrodes 114n are disposed at a lower level than the bottom surfaces b2 of the active gate electrodes 114a.

Figure 6:
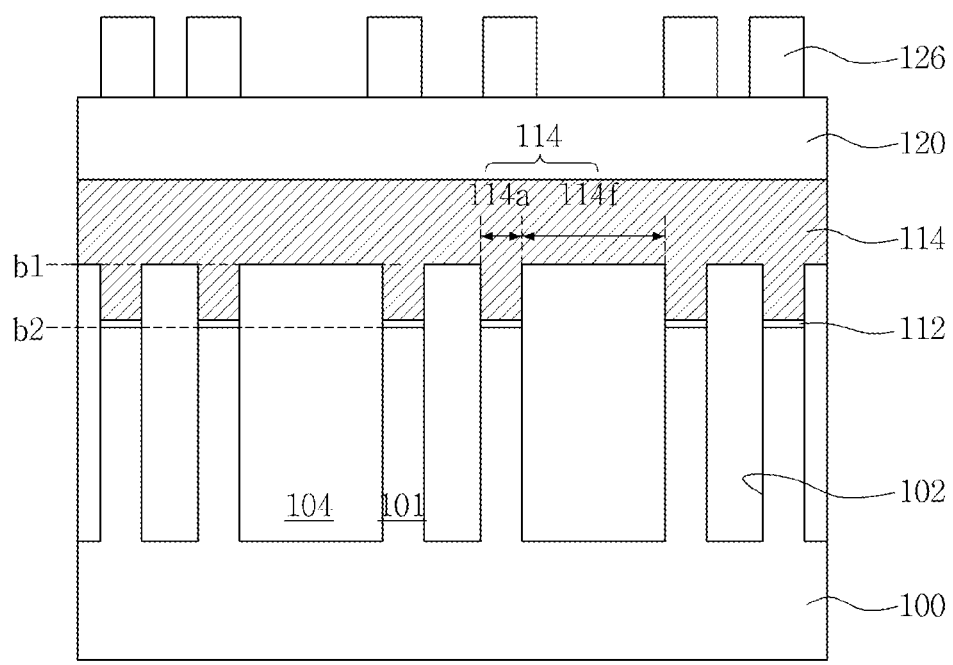
FIG. 6 is a cross-sectional view of a fourth embodiment of a semiconductor device according to the inventive concept as taken along line I-I' of FIG. 1.

A fourth embodiment of the inventive concept will now be described with reference to FIGS. 1 and 6. Here, again, features similar to those of the first embodiment will not be described in detail, though.

In this embodiment of a semiconductor device according to the inventive concept, the word lines 114 do not include fin gate electrodes. Also, the bottom surfaces b1 of the field gate electrodes 114f are disposed at a higher level than bottom surfaces b2 of the active gate electrodes 114a.

Also, a field gate electrode 114f disposed in the first region s1, and a field gate electrode 114f disposed in the second region s2 may have bottom surfaces disposed at the same level or have bottom surfaces disposed at different levels. For example, the field gate electrode 114f disposed in the first region s1 of the field region 104, where word line disturbance does not occur between adjacent cells, may have a bottom surface disposed at a lower level than a bottom surface of the active gate electrode 114a.

A first embodiment of a method of manufacturing a semiconductor device according to the inventive concept will now be described with reference to FIGS. 7A through 7G and FIGS. 8A through 8D. This embodiment may form a device of the type shown in and described with reference to FIGS. 1, 3A and 3B and so reference will be made to the features of this device in describing the method.

Figure 7A:
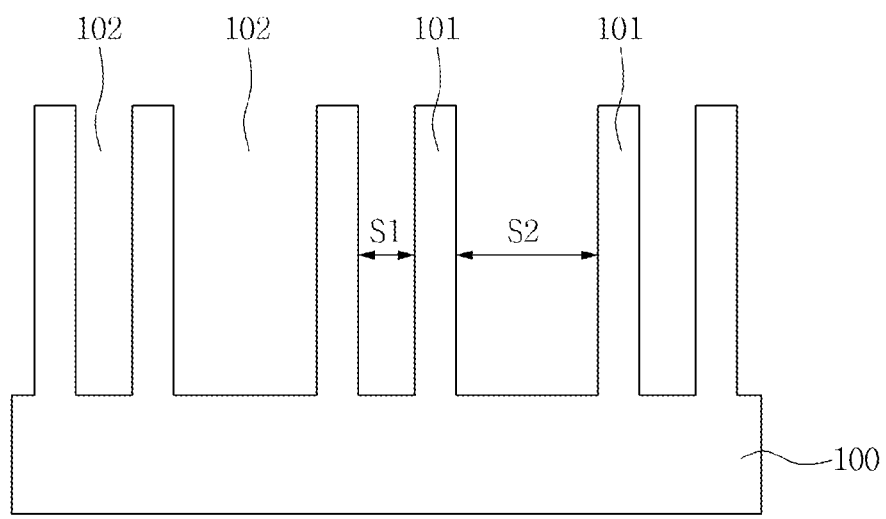
FIGS. 7A-8D illustrate a first embodiment of a method of manufacturing a semiconductor device according to the inventive concept, with FIGS. 7A, 7B, 7C, 7D, 7E, 7F and 7G each being a cross-sectional view taken in a direction corresponding to that of line I-I' of FIG. 1 and FIGS. 8A, 8B, 8C and 8D each being a cross-sectional view taken in a direction corresponding to that of line II-II' of FIG. 1.
Figure 8A:
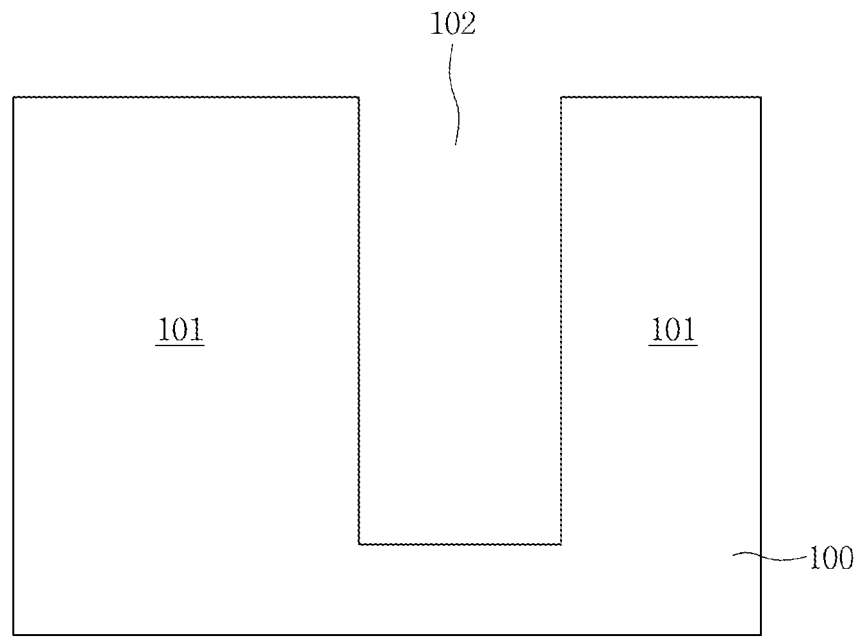

Referring first to FIGS. 1, 7A, and 8A, substrate 100 is prepared (provided). For example, the substrate 100 may be a semiconductor wafer, such as a silicon wafer. The substrate 100 may include a memory cell array region in which memory cells are to be formed, and a peripheral circuit region in which peripheral circuits configured to operate the memory cells are to be formed.

The substrate 100 is etched to a predetermined depth to form isolation trenches 102 in the substrate 100 defining the active regions 101.

Figure 7B:
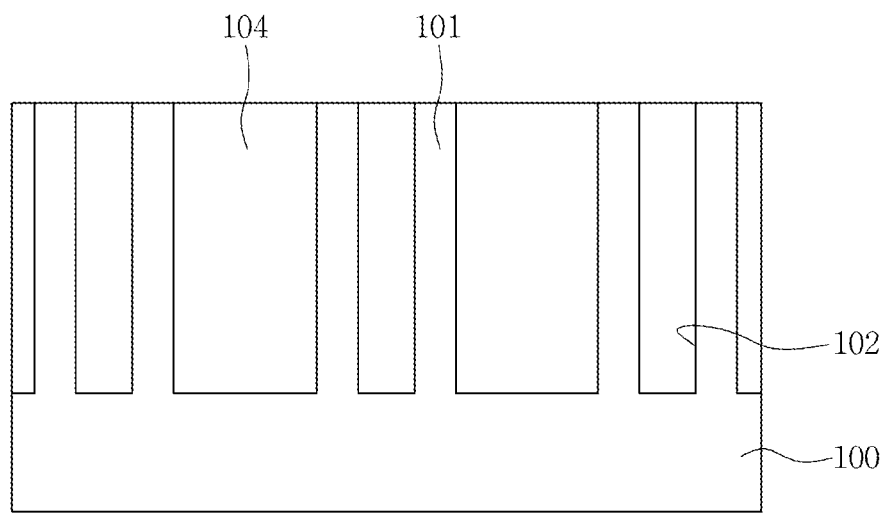
Figure 8B:
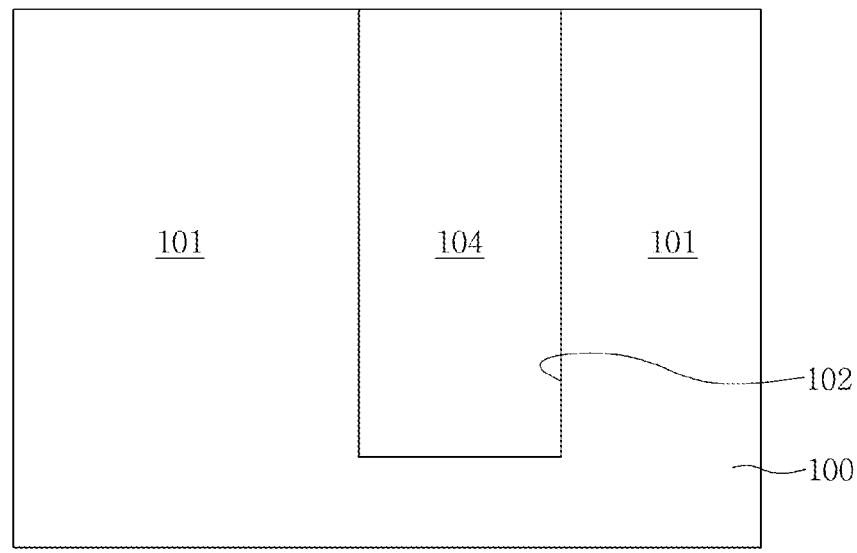
Figure 8C:
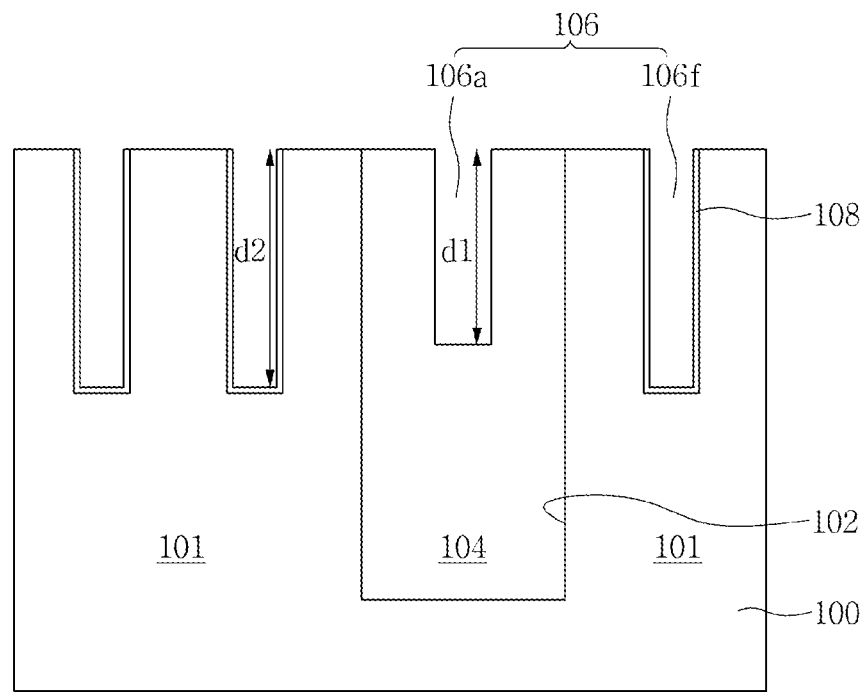

Referring to FIGS. 1, 7B, and 8B, an insulating layer of, silicon oxide, for example, is deposited on the substrate 100 including the trenches 102. Subsequently, the insulating layer is planarized, e.g., etched back, to expose the surface of the substrate 100 so that trench isolation regions, that is, the field regions 104, are formed within the trenches 102.

Referring to FIGS. 1, 7C, 7D, and 8C, 8D, the first and second impurity regions 117s and 117d are formed in upper portions of the active regions 101 and serve as source and drain regions of transistors. The forming of the first and second impurity regions 117s and 117d may comprise implanting impurities into the active regions 101 using an ion implantation process.

Next, a mask (not shown) is formed on the substrate 100. The mask has openings which run across the active regions 101 and extend onto the field regions 104. The mask may be formed by photolithography. Then the substrate 100 is etched using the mask as an etch mask to form the gate trenches 106 in the substrate 100. As was described above, each of the gate trenches 106 includes an active trench 106a extending across an active region 101, and a field trench 106f in a corresponding field region 104.

Also, the field trench 106f is formed to a depth d1 smaller than the depth d2 of the active trench 106a. In this respect, the field trench 106f and the active trench 106a can be formed to different depths simultaneously, i.e., by a single etch process, by using a difference in etch selectivity between silicon and silicon oxide when, for example, the substrate 100 is formed of silicon and the field region 104 is formed of silicon oxide.

Note, too, that the first and second impurity regions 117s and 117d may be formed after the gate trenches 106 are formed.

After forming the gate trenches 106, the gate insulating layers 108 are formed in the gate trenches 106. For instance, the gate insulating layers 108 may be formed by performing an oxidation process on the substrate 100 to form silicon oxide layers on the surfaces of the active regions 101 delimiting the gate trenches 106. The gate insulating layers 108 may be formed of silicon oxide or nitrogen (N)-doped silicon oxide.

Figure 7C:
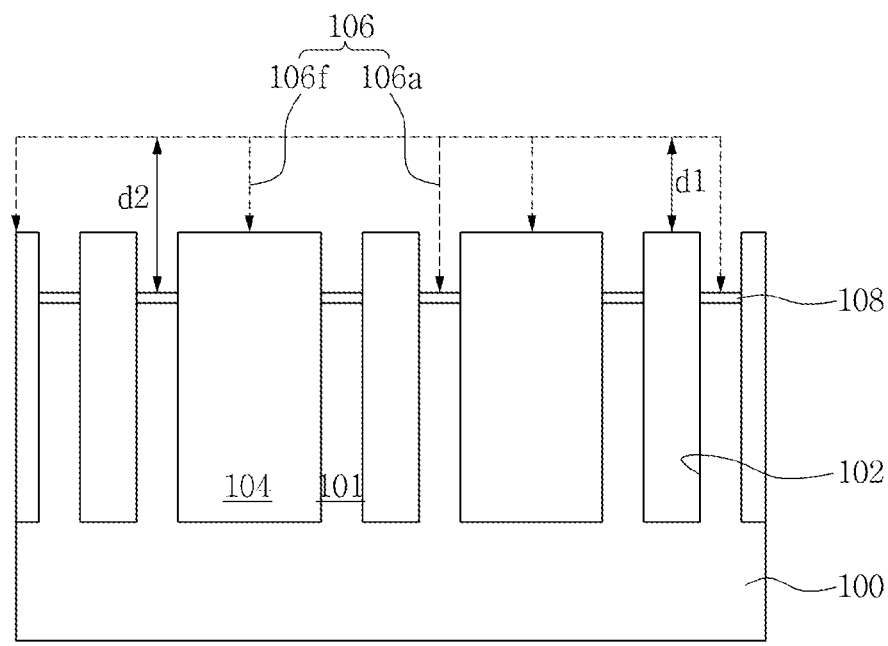
Figure 7D:
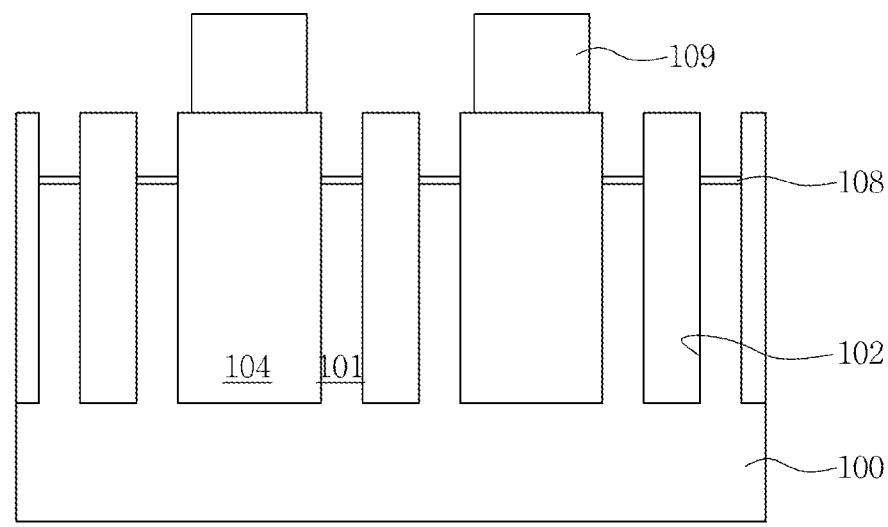

Referring to FIGS. 1 and 7D, a mask 109 is then formed on the field region (refer to A in FIG. 1) between the first impurity regions 117s of the active regions 101 disposed adjacent to each other. For example, the mask 109 may cover a central portion of each second region s2 of the field region 104.

Figure 7E:
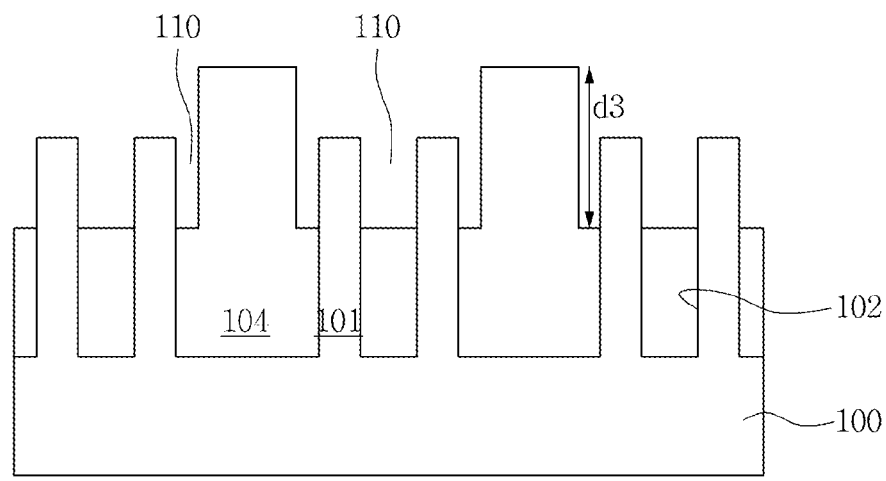

Referring to FIGS. 1 and 7E, the portions of the field region 104 exposed by the mask 109 are etched using the mask 109 as an etch mask. As a result, the fin recesses 110 are formed to a predetermined depth, namely, a depth d3 greater than the depth d2 to which the active trenches 106a are formed. In this example, the fin recesses 110 are simultaneously formed in the first region s1 of each of the field regions 104 and in the second region s2 of each of the field regions 104 between adjacent ones of the active regions 101 in the word line direction. The mask 109 may then be removed.

Figure 7F:
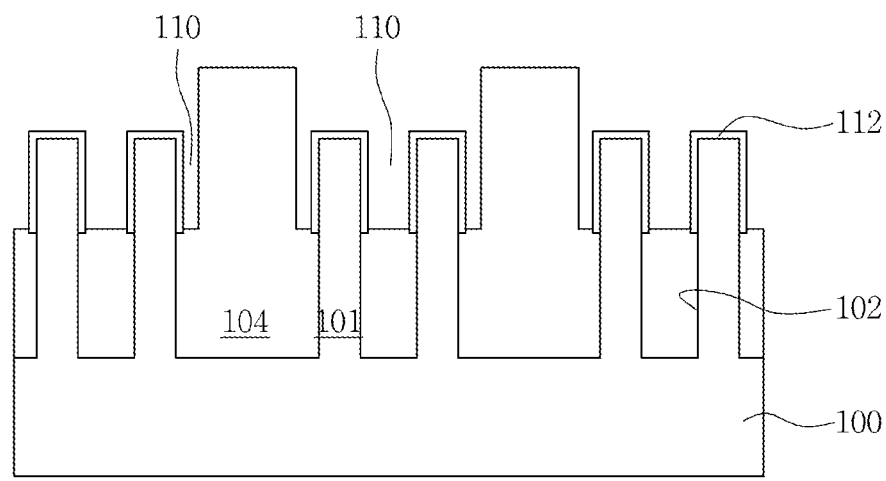

Referring to FIGS. 1 and 7F, the gate insulating layers 108 exposed by the mask 109 may be etched, in addition to the field region 104, during the etching process for forming the fin recesses 110. Accordingly, fin insulating layers 112 may be formed on those regions of the substrate 100 exposed by the fin recesses 110 to compensate for etching damage to the gate insulating layers 108. For example, the fin insulating layer 112 is formed by performing an oxidation process on the substrate 100 to form silicon oxide layers on the active regions 101 exposed by the fin recesses 110.

Figure 7G:
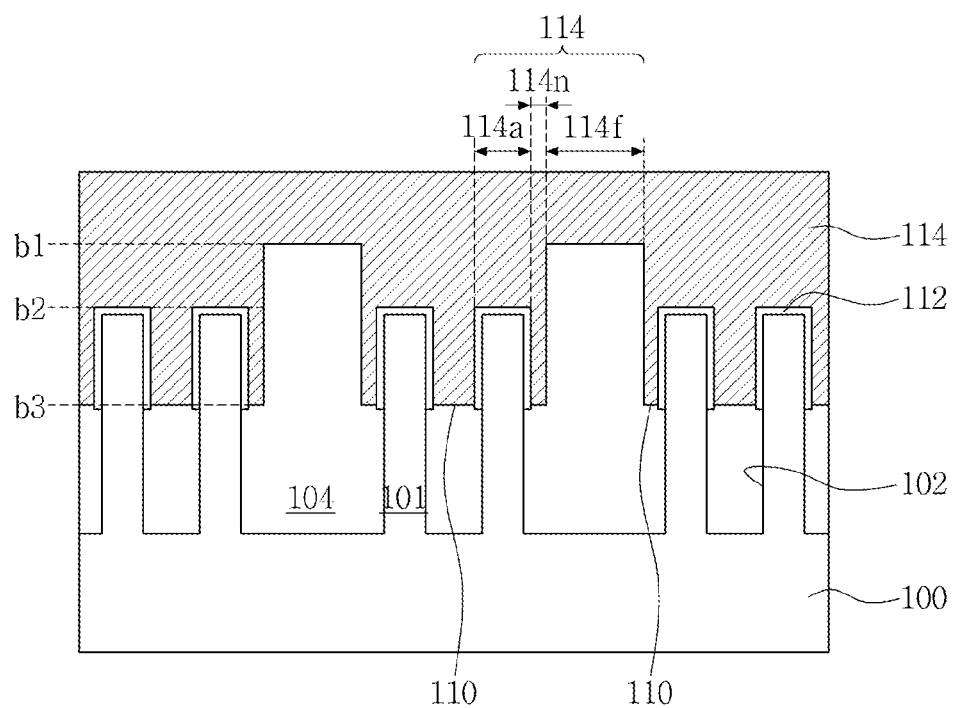
Figure 8D:
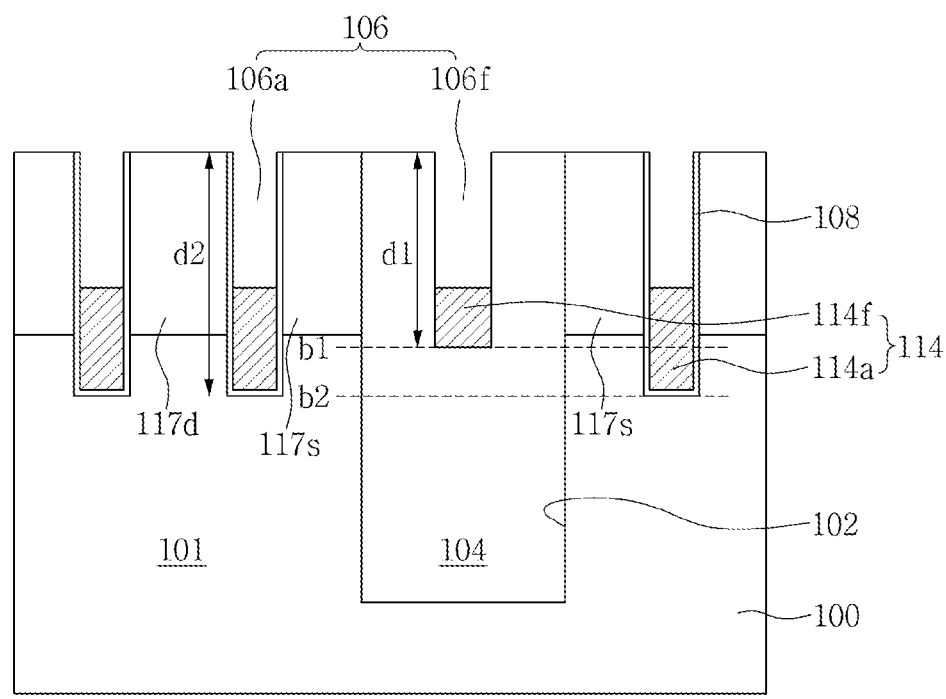

Referring to FIGS. 1, 7G, and 8D, a conductive layer formed of, for example, a metal, is deposited on the substrate 100 and patterned, thereby forming word lines 114 each including an active gate electrode 114a disposed within the active trench 106a, a field gate electrode 114f disposed within the field trench 106f, and a fin gate electrode 114n disposed within the fin recess 110.

Subsequently, and referring to FIG. 3B, gate capping layers 116 may be formed on the substrate 100 having the word lines 114, thereby completing the formation of the gate structures 115. For example, the gate capping layer 116 may be formed by depositing capping insulating layer on the substrate 100 having the word lines 114, and planarizing the capping insulating layer.

The gate capping layer 116 may then be etched to form contact holes exposing the first and second impurity regions 117s and 117d of the transistors. Then, conductive material may be formed in the contact holes, i.e., may be buried in the gate capping layer 116, thereby forming the storage contact pads 118s and bit line contact pads 118b electrically connected to the first and second impurity regions 117s and 117d.

First interlayer insulating layer 120 is then formed on the substrate 100. The first interlayer insulating layer 120 may be formed of silicon oxide or silicon nitride.

The first interlayer insulating layer 120 is then etched to form bit line contact holes 122 exposing the second impurity regions 117d. The bit line contact holes 122 are filled with a conductive material, thereby forming bit line contact plugs 124 electrically connected to the bit line contact pads 118b. Next, a conductive layer is deposited on the bit line contact plugs 124 and the first interlayer insulating layer 120 and is patterned to thereby form bit lines 126 electrically connected to the second impurity regions 117d.

A second interlayer insulating layer 128 is then formed on the substrate 100 over the bit lines 126. The second interlayer insulating layer 128 may be formed of silicon oxide or silicon nitride.

The second interlayer insulating layer 128 and the first interlayer insulating layer 120 are etched to form storage contact holes 130 exposing the storage contact pads 118s. The storage contact holes 130 are then filled with a conductive material, thereby forming storage contact plugs 132 electrically connected to the storage contact pads 118s. Next, a conductive layer is deposited on the storage contact plugs 132 and the second interlayer insulating layer 128 and patterned, thereby forming capacitor electrodes 134 electrically connected to the first impurity regions 117s.

A second embodiment of a method of manufacturing a semiconductor device according to the inventive concept will now be described with reference to FIGS. 9A through 9E. This embodiment may form a device of the type shown in and described with reference to FIGS. 1 and 4 and so reference will be made to the features of this device in describing the method.

Figure 9A:
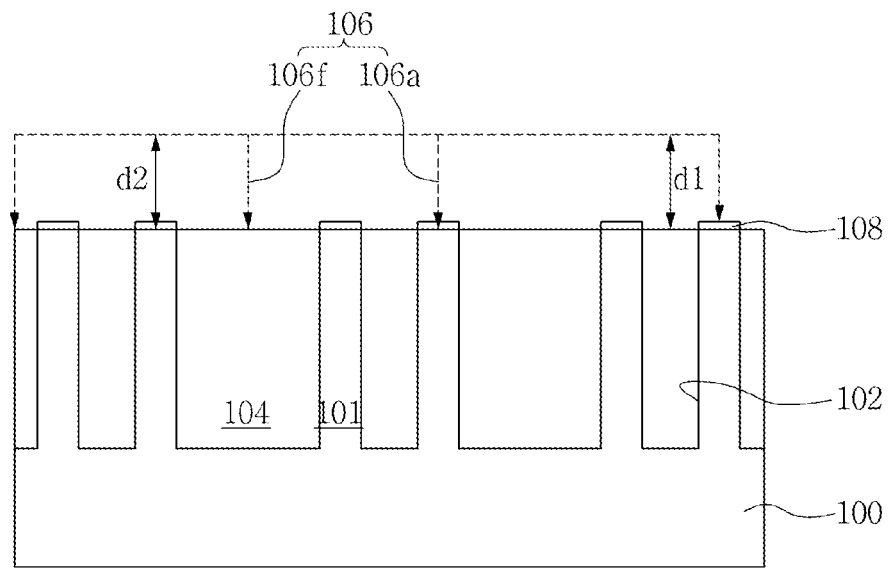
FIGS. 9A, 9B, 9C, 9D and 9E are cross-sectional views illustrating a second embodiment of a method of manufacturing a semiconductor device according to the inventive concept.

Referring first to FIG. 9A, a substrate 100 having gate trenches 106 and gate insulating layers 108 is formed similarly to the way in which the structure of FIG. 7C is formed. However, in this case, each of the gate trenches 106 is formed to a uniform depth such that the field trench 106f is formed to a depth d1 equal to the depth d2 of the active trench 106a.

Figure 9B:
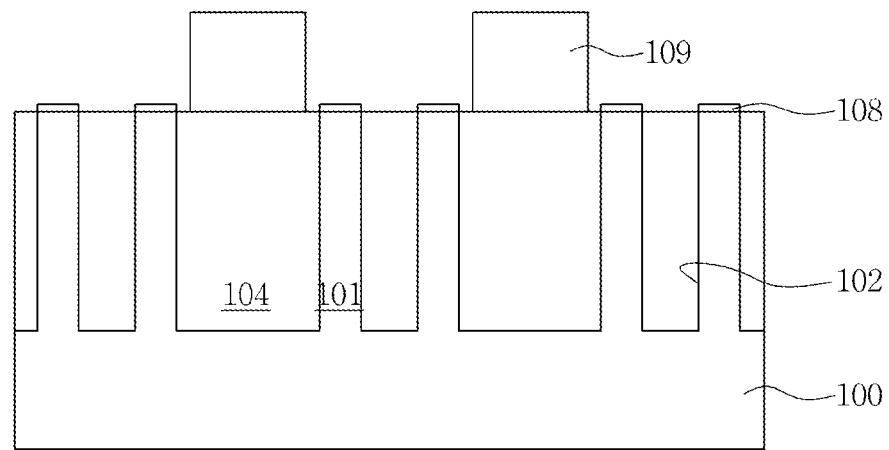

Referring to FIG. 9B, a mask 109 is formed on the field region (refer to A in FIG. 1) between the first impurity regions 117s of adjacent ones of the active regions 101 in the a first direction, namely, the word line direction. For example, the mask 109 is formed to cover central portions of the second regions s2 of the field regions 104 in the first line direction.

Figure 9C:
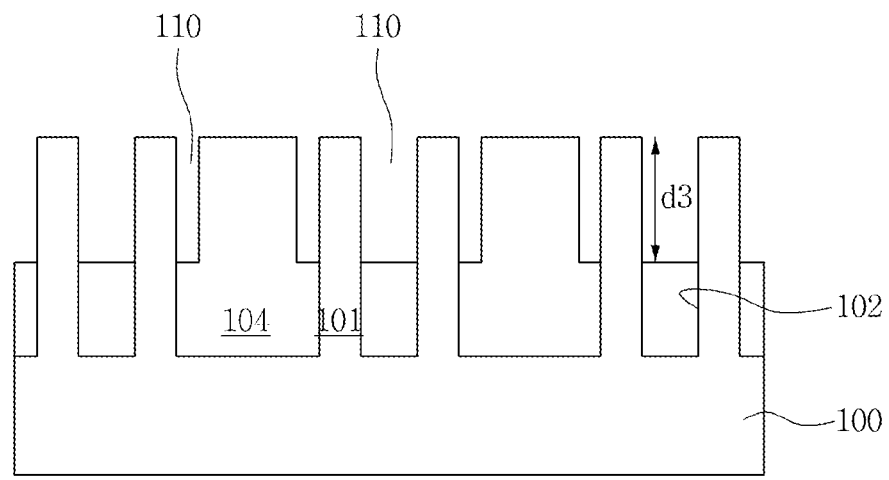

Referring to FIG. 9C, the exposed region of the field region 104 is etched using the mask 109 as an etch mask to form the fin recesses 110 to a depth d3 greater than the depth d1 to which the field trenches 106f and the depth d2 to which the active trenches 106a are formed. The fin recesses 110 are formed adjacent the sides of the active regions 110 in the first direction. In this example, the fin recesses 110 are simultaneously formed in the first region s1 of each of the field regions 104 and in the second region s2 of each of the field regions 104 between adjacent ones of the active regions 101 in the word line direction. The mask 109 may then be removed.

Figure 9D:
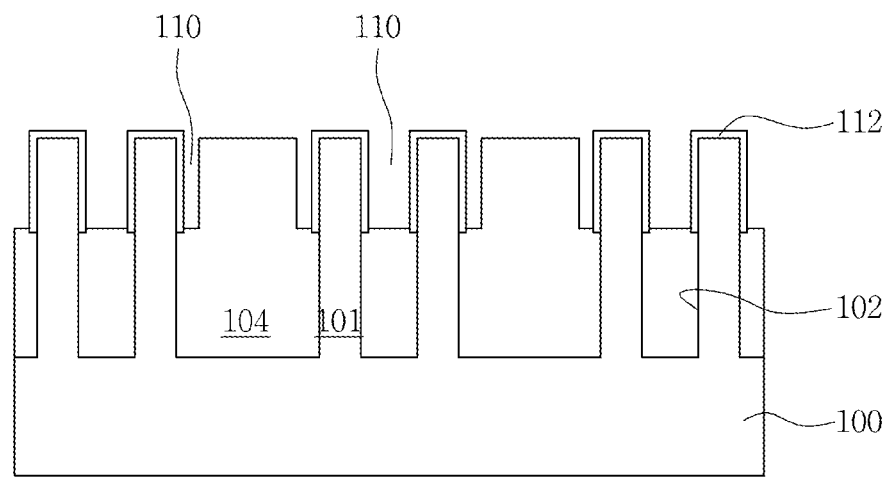

Referring to FIG. 9D, the gate insulating layers 108 exposed by the mask 109 may be etched, in addition to the field region 104, during the etching process for forming the fin recesses 110. Accordingly, fin insulating layers 112 may be formed on those regions of the substrate 100 exposed by the fin recesses 110 to compensate for etching damage to the gate insulating layers 108. For example, the fin insulating layer 112 is formed by performing an oxidation process on the substrate 100 to form silicon oxide layers on the active regions 101 exposed by the fin recesses 110.

Figure 9E:
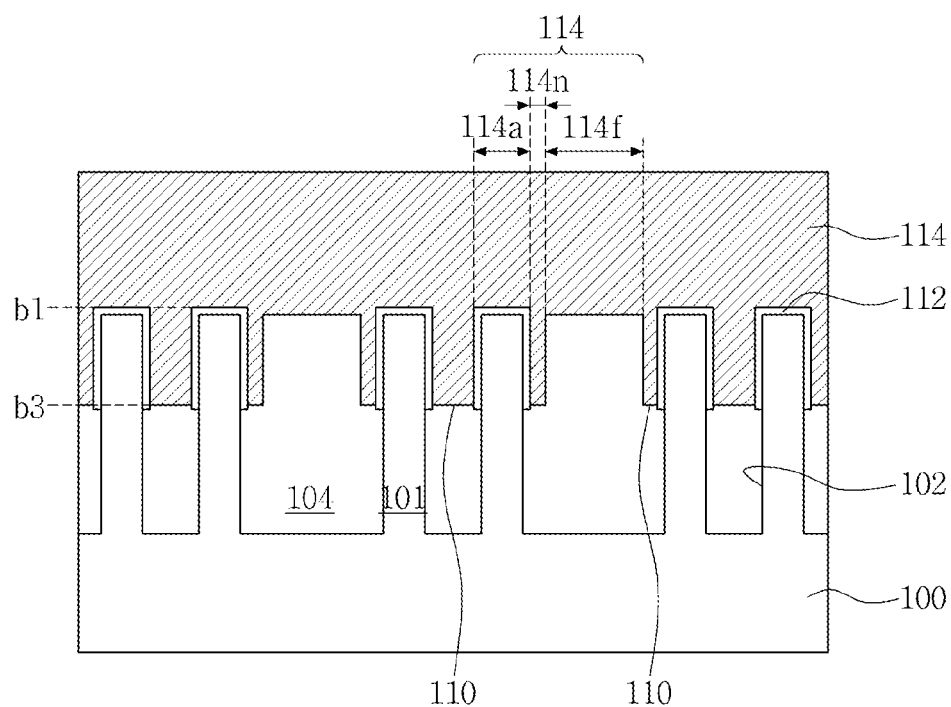

Referring to FIG. 9E, a conductive layer is deposited on the substrate 100 and patterned, thereby forming word lines 114 each including an active gate electrode 114a occupying an active trench 106a, a field gate electrode 114f occupying a corresponding field trench 106f, and a fin gate electrode 114n disposed in a corresponding fin recess 110. And accordingly, the bottom surface b1 of the field gate electrode 114f formed on the second region s2 of the field region 104 is disposed at a higher level than the bottom surface b3 of the fin gate electrode 114n.

Subsequently, the processes described above with reference to FIG. 3B are performed. As a result, a semiconductor device of the type described with reference to FIG. 4 is formed.

A third embodiment of a method of manufacturing a semiconductor device according to the inventive concept will be described with reference to FIGS. 10A through 10D. This embodiment may form a device of the type shown in and described with reference to FIGS. 1 and 5 and so reference will be made to the features of this device in describing the method.

Figure 10A:
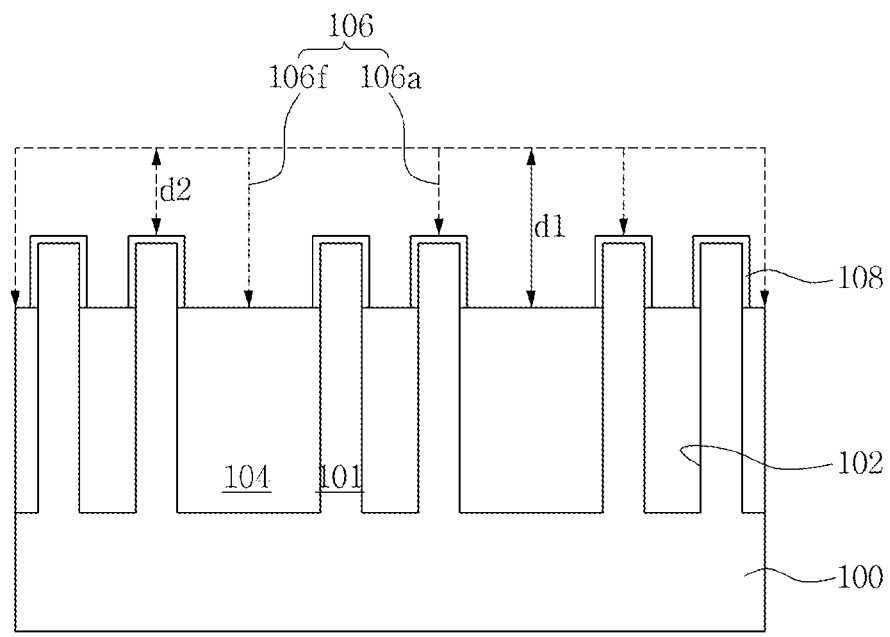
FIGS. 10A, 10B, 10C and 10D are cross-sectional views illustrating a third embodiment of a method of manufacturing a semiconductor device according to the inventive concept.

Referring first to FIG. 10A, a structure is formed using processes similar to those described with reference to FIGS. 7A through 7C. Thus, a substrate 100 having gate trenches 106 and gate insulating layers 108 is formed. However, in this case, each gate trenches 106 includes an active trench 106a disposed across an active region 101, and a field trench 106f formed in a field region 104, and the field trench 106f is formed to a depth d1 greater than the depth d2 to which the active trench 106a is formed.

Figure 10B:
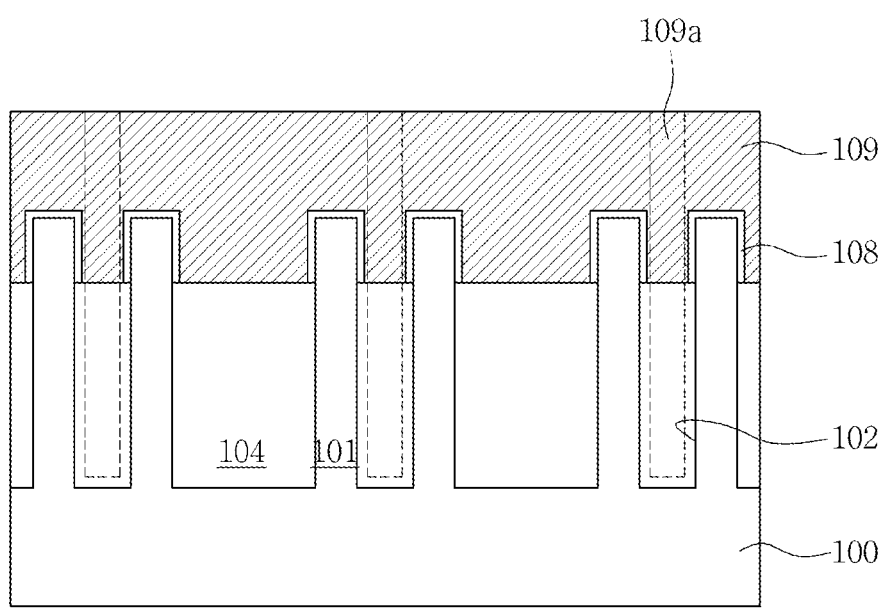

Referring to FIG. 10B, a mask 109 is formed on the substrate 100. The mask 109 has openings 109a exposing the first regions s1 of the field region 104.

Figure 10C:
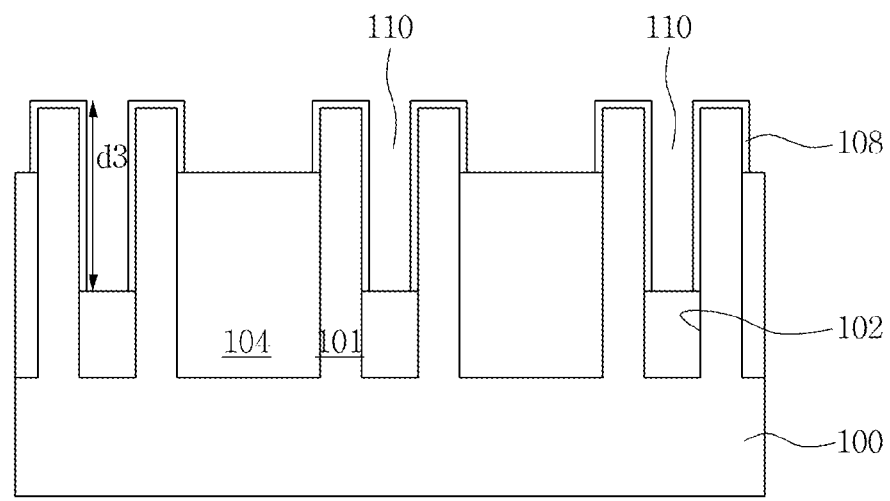

Referring to FIG. 10C, the field oxide 104 is etched using the mask pattern 109 as an etch mask. As a result, fin recesses 110 are formed in the first regions s1 of the field region 104. The fin recesses 110 are formed to a depth d3 greater than the depth d1 of the field trenches 106f. The mask 109 may then be removed.

The gate insulating layers 108 exposed by the mask 109 may be etched, in addition to field region 104, during the etching process for forming the fin recesses 110. Accordingly, fin insulating layers 112 may be formed on those regions of the substrate 100 exposed by the fin recesses 110 to compensate for etching damage to the gate insulating layers 108. For example, the fin insulating layer 112 is formed by performing an oxidation process on the substrate 100 to form silicon oxide layers on the active regions 101 exposed by the fin recesses 110.

Figure 10D:
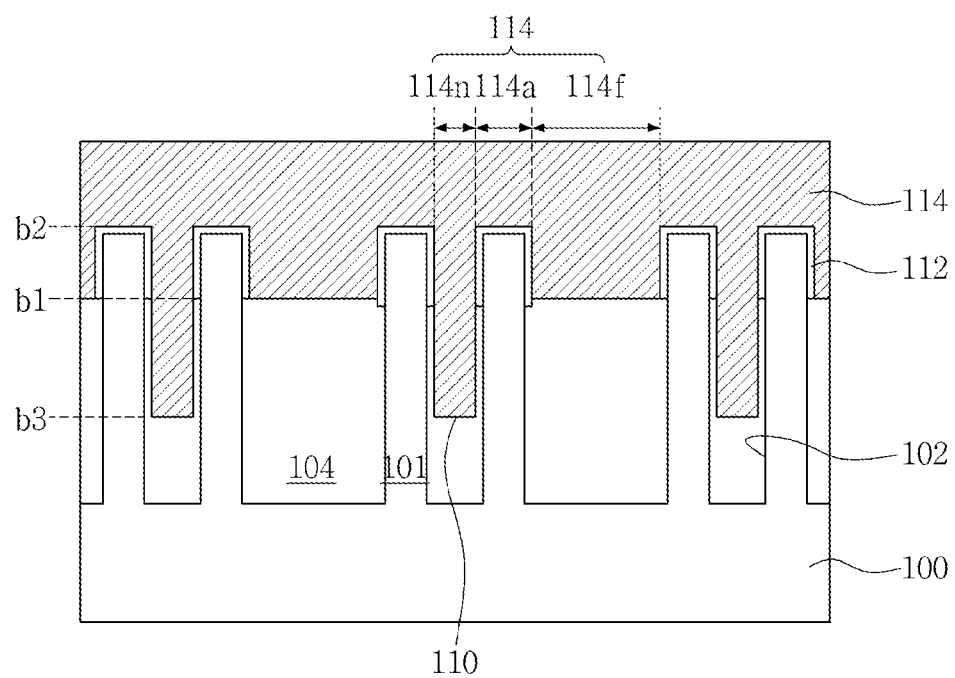

Referring to FIG. 10D, a conductive layer is deposited on the substrate 100 having the fin insulating layers 112 and patterned, thereby forming word lines 114 each including an active gate electrode 114a occupying an active trench 106a, a field gate electrode 114f occupying the corresponding field trench 106f, and a fin gate electrode 114n disposed in a corresponding fin recess 110. And accordingly, the bottom surface b1 of field gate electrode 114f formed on the second region s2 of the field region 104 is disposed at a higher level than the bottom surface b3 of the fin gate electrode 110. Also, the bottom surface b3 of the fin gate electrode 110 is disposed at a lower level than the bottom surface b2 of the active gate electrode 114a.

Figure 3B:
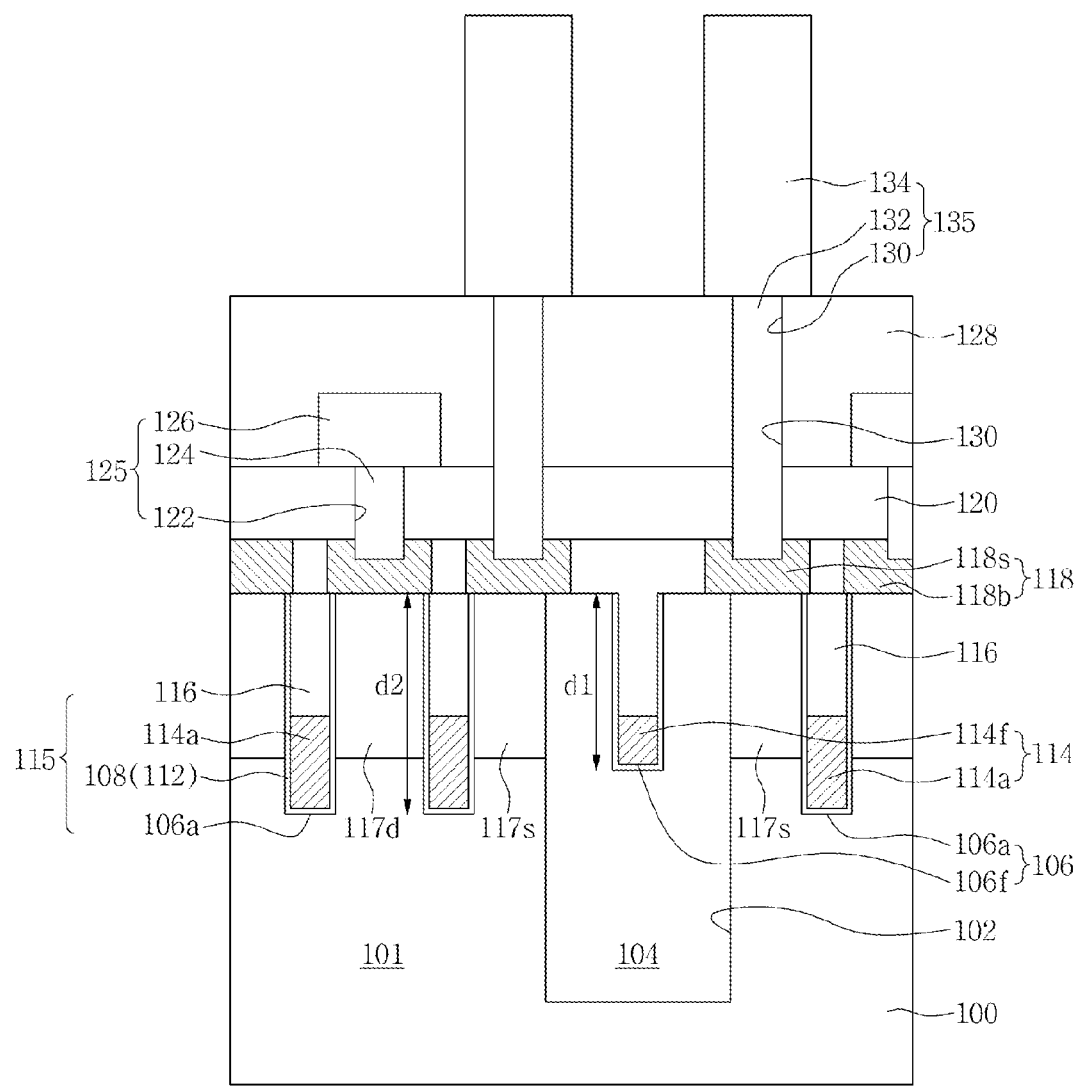
FIG. 3B is a cross-sectional view of the sane semiconductor device as taken along line II-II' of FIG. 1.

Subsequently, the processes described with reference to FIG. 3B are performed. As a result, a semiconductor device of the type described with reference to FIG. 5 is formed.

A fourth embodiment of a method of manufacturing a semiconductor device according to the inventive concept will now be described with reference to FIGS. 11A and 11B. This embodiment may form a device of the type shown in and described with reference to FIGS. 1 and 6 and so reference will be made to the features of this device in describing the method.

Figure 11A:
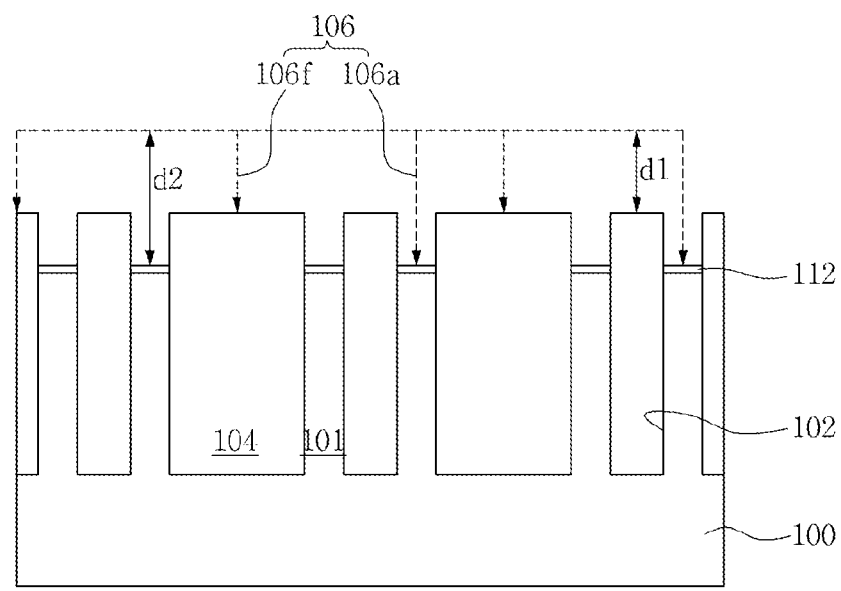
FIGS. 11A and 11B are cross-sectional views illustrating a fourth embodiment of a method of manufacturing a semiconductor device according to the inventive concept.

Referring to FIG. 11A, a substrate 100 having gate trenches 106 and gate insulating layers 108 is formed. In this case, each gate trenches 106 includes an active trench 106a disposed across an active region 101, and a field trench 106f formed in a field region 104, and the field trench 106f is formed to a depth d1 less than the depth d2 to which the active trench 106a is formed.

Figure 11B:
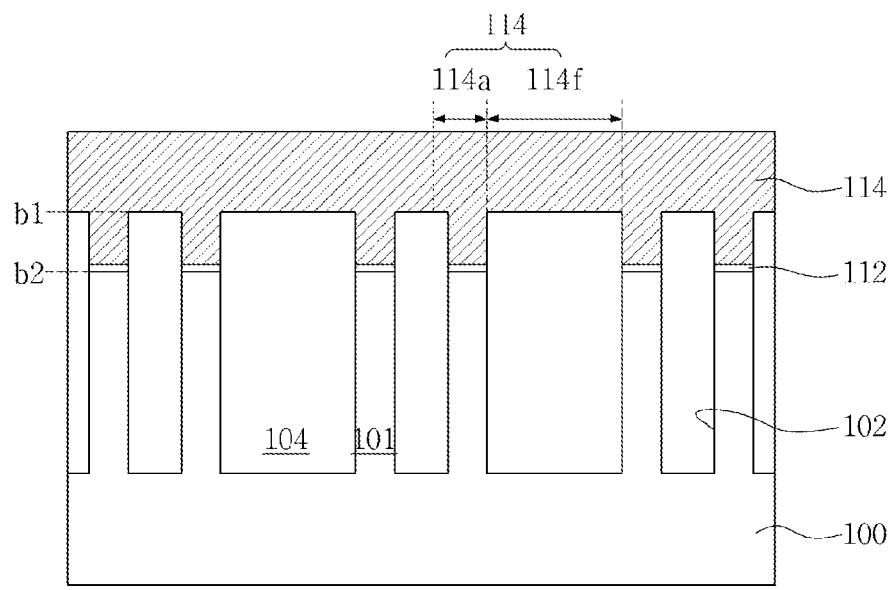

Referring to FIG. 11B, a conductive layer is then deposited on the substrate 100, thereby forming word lines 114 each including active gate electrodes 114a disposed in the active trenches 106a, and field gate electrodes 114f disposed in the corresponding field trenches 106f.

Subsequently, the processes described with reference to FIG. 3B are performed. As a result, a semiconductor device of the type described with reference to FIG. 6 is formed.

Figure 12:
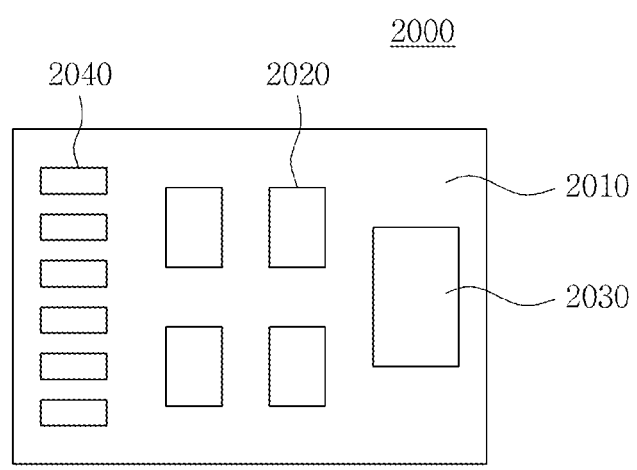
FIG. 12 is a schematic diagram of a semiconductor module having a semiconductor device according to the inventive concept.

FIG. 12 illustrates a semiconductor module 2000 having a semiconductor device according to the inventive concept.

Referring to FIG. 12, the semiconductor module 2000 includes a control unit 2020, a storage unit 2030, and input/output (I/O) units 2040 disposed on a module substrate 2010.

The module substrate 2010 may comprise a printed circuit board (PCB).

The control unit 2020 comprises a logic device, such as a controller.

The storage unit 2030 may include a memory device, such as a dynamic random access memory (DRAM), a magnetic RAM (MRAM), or a NAND flash memory.

The I/O units 2040 may include conductive terminals.

The control unit 2020 and/or the storage unit 2030 may include a semiconductor device according to any of the embodiments of the inventive concept or a semiconductor device manufactured using any of the embodiments of a method according to the inventive concept.

The semiconductor module 2000 may be a memory card and hence, may comprise a solid-state drive (SSD).

Figure 13:
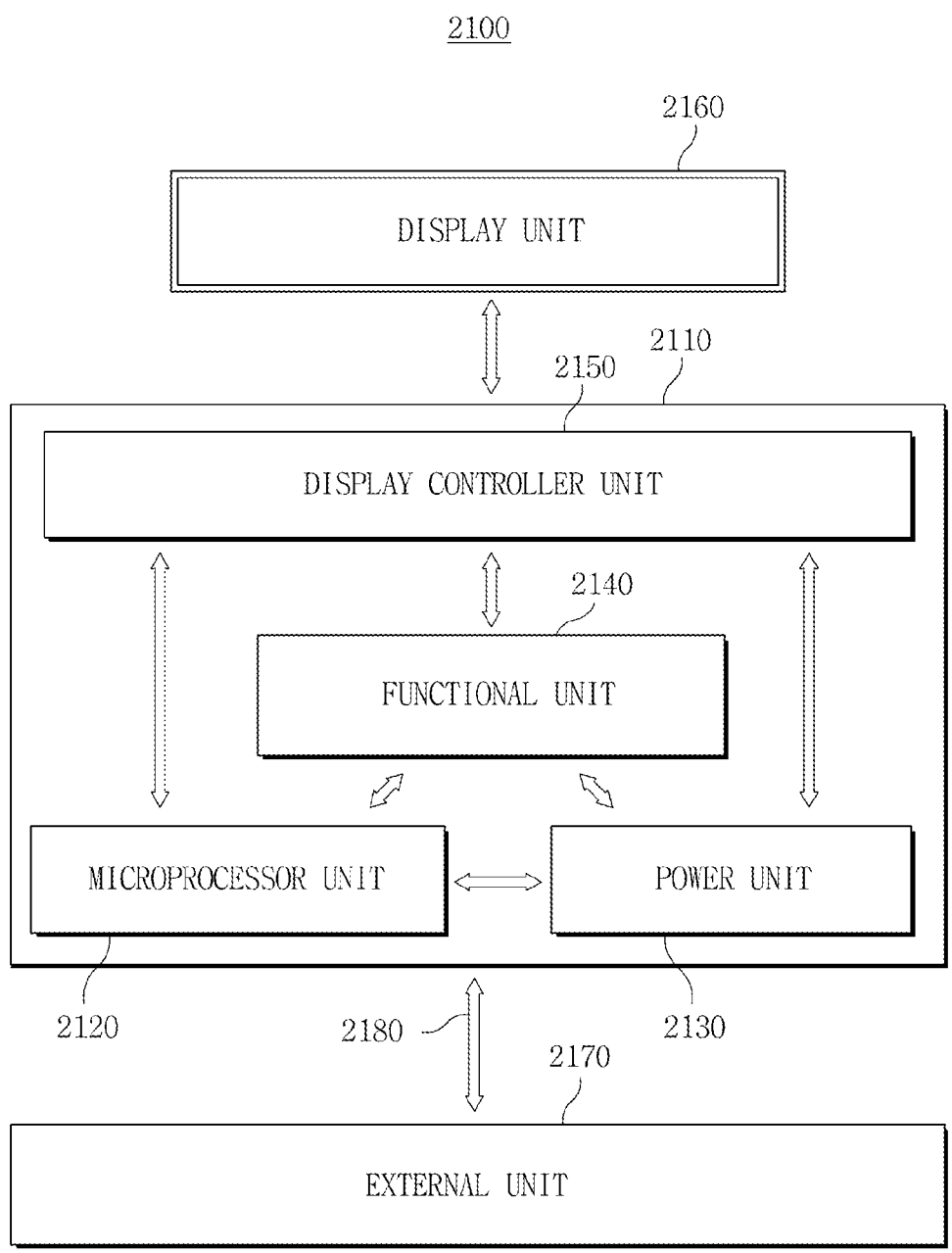
FIG. 13 is a block diagram of an electronic system having a semiconductor device according to the inventive concept.

FIG. 13 illustrates an electronic system 2100 including a semiconductor device according to the inventive concept.

The electronic system 2100 includes a microprocessor (MP) unit 2120, a power unit 2130, a functional unit 2140, and a display controller unit 2150 integrated by a body 2110 of the system. The body 2110 may be a system board or motherboard constituted by a PCB. In this case, the MP unit 2120, the power unit 2130, the functional unit 2140, and the display controller unit 2150 are mounted on the body 2110.

The system 2100 also includes a display unit 2160. The display unit 2160 may be disposed on a top surface of the body 2110 or outside the body 2110. For example, the display unit 2160 may be disposed on a surface of the body 2110 and display an image processed by the display controller unit 2150.

The power unit 2130 may receive a predetermined voltage from an external power source, divide the predetermined voltage into various voltage levels, and transmit the divided voltages to the MP unit 2120, the functional unit 2140, and the display controller unit 2150.

The MP unit 2120 may receive a voltage from the power unit 2130 and control the functional unit 2140 and the display unit 2160.

The functional unit 2140 may implement various functions of the electronic system 2100. For instance, when the electronic system 2100 is a mobile electronic product, such as a portable phone, the functional unit 2140 may include several elements capable of performing wireless communication functions, such as outputting an image to the display unit 2160 or outputting sound (voice) to a speaker, and dialing or facilitating communication with an external unit 2170. When the functional unit 2140 includes a camera, the functional unit 2140 may serve as an image processor.

In another application, the electronic system 2100 may be connected to a memory card to increase the capacity of the electronic system 2100. In this case, the functional unit 2140 may be a memory card controller.

In any case, the functional unit 2140 may exchange signals with the external apparatus 2170 through a wired or wireless communication unit 2180.

In addition, in an application in which the electronic system 2100 employs a universal serial bus (USB), the functional unit 2140 may serve as an interface controller.

At least one of the MP unit 2120 and the functional unit 2140 includes an embodiment of a semiconductor device according to the inventive concept, or a semiconductor device manufactured using an embodiment of a method according to the inventive concept.

According to an aspect of the inventive concept as described above, the bottom surface of a field gate electrode disposed across a field region (i.e., a pass gate electrode) is disposed at a higher level than the bottom surface of an active gate electrode (i.e., a cell electrode) disposed across an active region and/or the bottom surface of a fin gate electrode interposed between active regions and the field region so that word line disturbance between adjacent active regions can be reduced.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device comprising:
   a substrate, and a field region disposed in the substrate and defining active regions of the substrate, and
   wherein the substrate has active trenches therein extending in and across the active regions, and the field region has field trenches therein, and gate trenches each are constituted by respective ones of the active and field trenches together; and
   word lines each occupying the gate trenches, respectively, and each extending longitudinally in a first direction across a plurality of the active regions, and
   wherein the word lines include active gate electrodes disposed within the active trenches, field gate electrodes disposed within the field trenches, and fin gate electrodes,
   each of the fin gate electrodes having front and back surfaces spaced from each other in the first direction and a bottommost surface extending between the front and back surfaces in the first direction,
   each of the fin gate electrodes having a center midway between the front and back surfaces thereof in the first direction, each of the active and field gate electrodes having a center in the first direction, and the centers of the fin gate electrodes being spaced in the first direction with respect to the centers of respective ones of the active and field gate electrodes, and
   each of the field gate electrodes has a bottommost surface disposed at a level higher than that of the bottommost surfaces of the fin gate electrodes.

2. A semiconductor device comprising:
   a substrate, and a field region disposed in the substrate and defining active regions of the substrate, and
   wherein the field region has first sections each of which spaces respective ones of the active regions apart from one another by a first distance in the first direction, and second sections each of which spaces respective ones of the active regions apart from one another by a second distance greater than the first distance in the first direction,
   wherein the substrate has active trenches therein extending in and across the active regions, the field region has field trenches extending in the first and second sections of the field region, and gate trenches each are constituted by respective ones of the active and field trenches together; and word lines each occupying the gate trenches, respectively, and each extending longitudinally in a first direction across a plurality of the active regions, and wherein the word lines include active gate electrodes disposed within the active trenches, field gate electrodes disposed within the field trenches extending in the second sections of the field region such that the field gate electrodes are disposed on said second sections of the field region, and fin gate electrodes at least some of which are disposed in the field trenches extending in the first sections of the field regions such that said at least some of the fin gate electrodes are disposed on the first sections of the field region, and wherein each of the field gate electrodes has a bottommost surface disposed at a level higher than that of the bottommost surfaces of the fin gate electrodes.

3. The device of claim 2, wherein the field gate electrodes of the word lines have bottommost surfaces disposed at a level higher than that of the bottommost surfaces of the active gate electrodes.

4. The device of claim 1, wherein the fin gate electrodes are disposed on both sides of each of the active regions in the first direction.

5. The device of claim 1, wherein the bottommost surface of each of the fin gate electrodes is disposed at a level lower than the bottommost surface of each of the active gate electrodes.

6. The device of claim 1, wherein the field trenches have the same depth as the active trenches.

7. The device of claim 1, wherein the field trenches are deeper than the active trenches.

* * * * *